(12) United States Patent
Jain et al.

(10) Patent No.: US 10,151,805 B2
(45) Date of Patent: Dec. 11, 2018

(54) METHOD FOR CALIBRATION OF MAGNETIC SENSOR

(71) Applicants: STMicroelectronics International N.V., Amsterdam (NL); STMicroelectronics, Inc., Coppell, TX (US)

(72) Inventors: Mahaveer Jain, Greater Noida (IN); Mahesh Chowdhary, San Jose, CA (US)

(73) Assignees: STMicroelectronics, Inc., Coppell, TX (US); STMicroelectronics International N.V., Schiphol (NL)

( * ) Notice: Subject to any disclaimer, the term of this patent is extended or adjusted under 35 U.S.C. 154(b) by 303 days.

(21) Appl. No.: 14/974,402

(22) Filed: Dec. 18, 2015

(65) Prior Publication Data

US 2017/0176546 A1    Jun. 22, 2017

(51) Int. Cl.
  *G01R 35/00* (2006.01)
  *G01R 33/00* (2006.01)
(52) U.S. Cl.
  CPC ....... *G01R 33/0035* (2013.01); *G01R 35/005* (2013.01)
(58) Field of Classification Search
  CPC ................. G01R 33/0035; G01R 35/005
  USPC ........................................... 702/104
  See application file for complete search history.

(56) References Cited

U.S. PATENT DOCUMENTS

| | | | | |
|---|---|---|---|---|
| 5,117,375 | A * | 5/1992 | Worcester | G01C 17/38 324/245 |
| 8,575,929 | B1 * | 11/2013 | Wiegert | G01R 33/028 324/244 |
| 9,528,863 | B2 * | 12/2016 | Yost | G01D 18/008 |
| 2011/0248704 | A1 * | 10/2011 | Chowdhary | G01C 17/38 324/202 |
| 2014/0195185 | A1 * | 7/2014 | Anderson | G01P 3/44 702/88 |
| 2014/0278191 | A1 * | 9/2014 | Anderson | G01P 21/00 702/104 |

* cited by examiner

*Primary Examiner* — Caleb Henry
(74) *Attorney, Agent, or Firm* — Crowe & Dunleavy

(57) ABSTRACT

A method includes acquiring magnetic data from a magnetometer, processing the magnetic data to perform robust calibration, and generating optimum calibration parameters using a calibration status indicator. To that end, the method includes generating a calibration status indicator as a function of time elapsed since a last calibration and variation in total magnetic field in previously stored magnetic data, detecting anomalies, and extracting a sparse magnetic data set using comparison between the previously stored magnetic data and the magnetic data. Calibration parameters are generated for the magnetometer using a calibration method as a function of the magnetic data set. The calibration parameters are stored based on performing a validation and stability check on the calibration parameters, and weighted with the previously stored calibration parameters to produce weighted calibration parameters. Calibration settings are generated as a function of the weighted calibration parameters, if the weighted calibration parameters were produced.

20 Claims, 3 Drawing Sheets

METHOD FOR CALIBRATION OF MAGNETIC SENSOR

TECHNICAL FIELD

This disclosure relates to the field of magnetic sensors, and, more particularly, to the calibration of magnetic sensors.

BACKGROUND

Portable electronic devices, such as smartphones, smartwatches, tablets, wearables and the like are increasingly popular in the marketplace. Such devices perform many functions. In the furtherance of the performing of those functions, such devices may contain a variety of sensors such as accelerometers, gyroscope, barometers, and magnetometers.

Magnetometers may function to detect the magnetic field including the Earth's magnetic field along its axes. In operation, such magnetometers produce a voltage proportional to the strength and polarity of the Earth's magnetic field along the axis with which that magnetometer is directed. From this voltage, the intensity of the magnetic field along that axis may be calculated or estimated.

This magnetic field information may be used for determining the orientation of the electronic device relative to the Earth's magnetic North, for example, or may be used to determine a change in orientation of the electronic device, or other types of information. Since it is desirable to achieve high accuracy in the determination of heading with respect magnetic North, accurate and precise methods of calibrating such magnetometers (which are affected by multiple factors such as hard iron effect, soft iron effect, and magnetic anomalies) are necessary.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

A method disclosed herein includes acquiring magnetic data from a magnetometer, and in a processing device, and method and steps for calibrating magnetometer sensor with high accuracy to output reliable measurements.

According to further aspects, the calibration process described here can automatically compute the quality of calibration, determine the need for calibration of sensor, and collect required magnetometer data from user normal movement or 8 pattern motion. The process to compute the calibration quality is based on parameters such as time elapsed since the latest successful calibration, the last anomaly detection event, and the absolute variation of total magnetic field.

The calibration process includes detection of anomaly to prevent computing incorrect calibration parameters. The accuracy of computing calibration parameters with anomaly detection process significantly improves the stability and accuracy of calibration process.

The calibration method may be ellipsoidal or spheroid fitting. The ellipsoid characterizes the inherent error such as soft iron effect, hard iron effect, and mechanical error (non-orthogonality of axes) in magnetometer sensor. Further, the process isolates the erroneous data by performing a robust ellipsoidal fitting on unique stored magnetometer measurements. The calibration parameters may be generated if calibration status indicator indicates that the time elapsed since a last calibration exceeds a threshold elapsed time and if the calibration status indicator indicates an anomaly in the magnetic data.

The stored magnetic data, to perform calibration, may be interpreted to minimum data sets reduced in dimension to perform stable calibration. The process further can reduce the data sets for memory and computational efficiency. The magnetic data set may be stored such that it has elements that are separated with fixed Euclidian distances with respect to adjacent elements and that were acquired during a given time interval.

The process of checking whether the magnetic data set is sufficient for the calibration method may include determining a number of unique samples in the magnetic data set, determining a range of the magnetic data set, and determining that the magnetic data set is sufficient if the number of unique samples exceeds a threshold number of unique samples and if the range of each axis exceeds a threshold range for each axis.

The calibration parameters may also be generated based upon the sanity check indicating that the stored unique magnetic data set is usable for the calibration method. Performing the sanity check on the stored magnetic data set may include eigenvalues comparison of a cross correlation matrix formed from the magnetic data set, and significant motion speed check.

The calibration parameters may be generated as a set of newly generated calibration parameters. These parameters may be stored as a plurality of sets of previously stored calibration parameters. The consistency check may include comparing the set of newly generated calibration parameters to the plurality of sets of previously stored calibration parameters and discarding a set of calibration parameters which is most inconsistent with other sets of calibration parameters. The new calibration parameters may be stored in the calibration parameter buffer is based on a time difference between generation of the new calibration parameters and the previously stored calibration parameters, and based on a consistency check between the calibration parameters and previously stored calibration parameters and a quality check on the calibration parameters. The calibration parameters and the previously stored calibration parameters are weighted to produce weighted calibration parameters, if the calibration parameters were stored in the calibration parameter store.

The new calibration parameters and the previously stored calibration parameters may be weighed as a function of quality and a difference between generation thereof and present time.

The magnetometer may be part of a portable electronic device, and the magnetometer may be operated pursuant to the calibration settings and changing a graphical display of the portable electronic device as a function of the magnetometer. Calibrated magnetic field strength measurements, when used in conjunction with acceleration data, can be used to determine device orientation with respect to magnetic North. The steps described above may be performed in the processing device in under two seconds. It should be appreciated that device counterparts are also within the scope of this disclosure.

DETAILED DESCRIPTION

The present description is made with reference to the accompanying drawings, in which example embodiments are shown. However, many different embodiments may be used, and thus the description should not be construed as limited to the embodiments set forth herein. Rather, these embodiments are provided so that this disclosure will be thorough and complete. Like numbers refer to like elements throughout.

Figure 1:
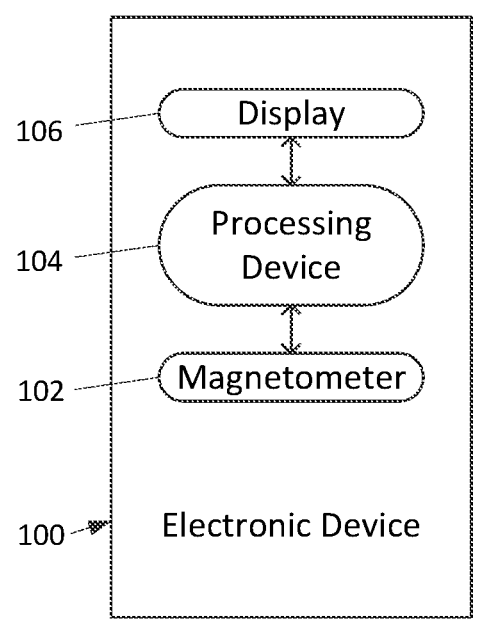
FIG. 1 is a block diagram of a portable electronic device such as may be used with the techniques disclosed herein.

Methods and techniques will be described herein for calibrating magnetic sensors, or magnetometers, used in electronic devices. Such a sample electronic device 100 will now be described with reference to FIG. 1. The electronic device 100 is portable and may be a smartphone, smartwatch, tablet, or be in another suitable form factor. The electronic device 100 includes a magnetic sensor or magnetometer 102 which produces a voltage proportional to the strength and polarity of the Earth's magnetic field along the axis with which that magnetometer is directed. A processing device 104, such as a microprocessor, programmable logic device, field programmable gate array, microcontroller, or system-on-chip is coupled to receive the output from the magnetometer 102. A display 106 is coupled to the processing device 104 for the purposes of displaying output, and may be touch sensitive for the purposes of receiving input.

Figure 2:
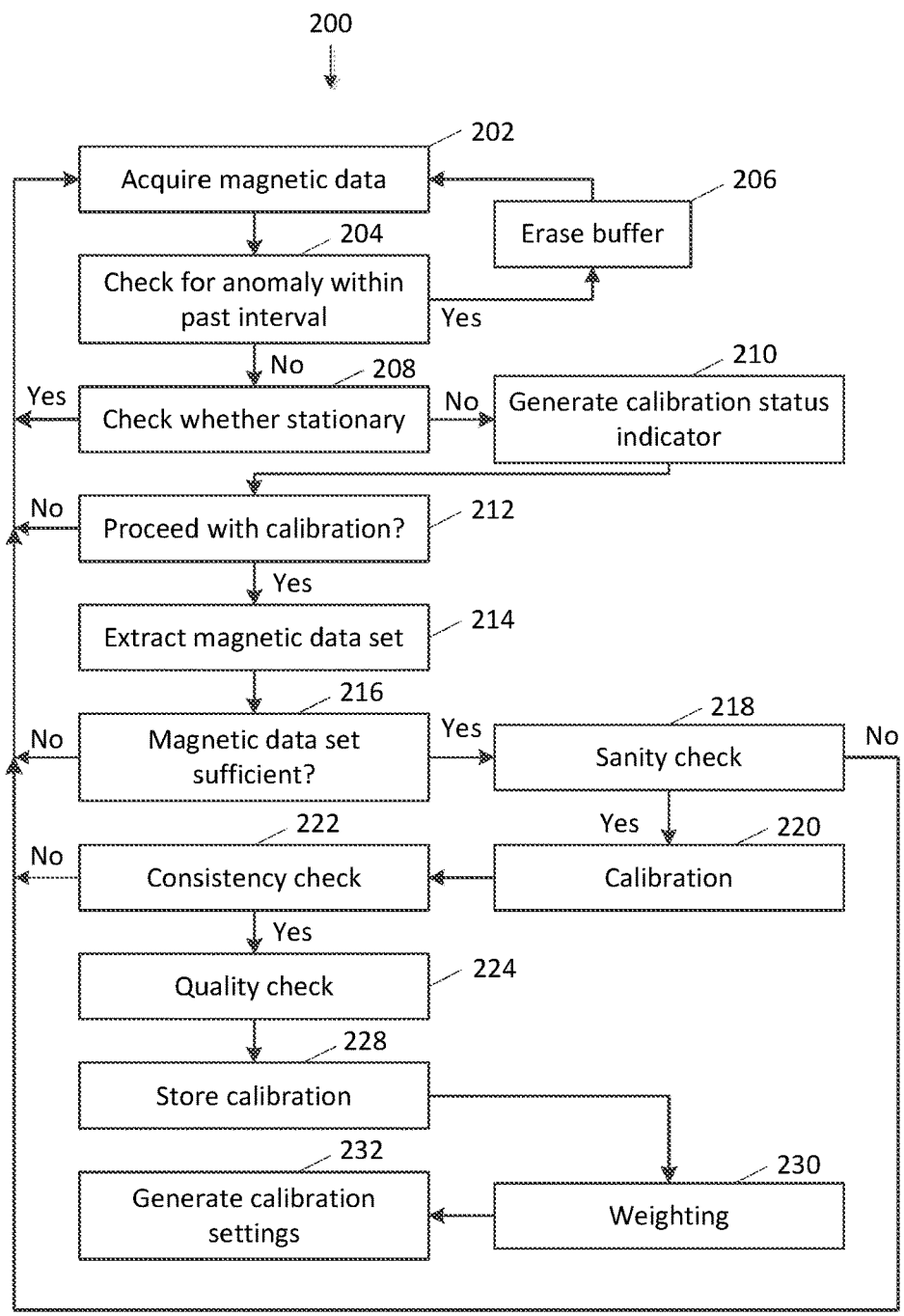
FIG. 2 is a flowchart of a method of calibrating a magnetic sensor for a portable electronic device.

With reference to the flowchart 200 of FIG. 2, a method of calibrating the magnetometer 102 is now described. It should be understood that any steps described herein may be performed by the processing device 104 even if not specifically described as such. Magnetic data is acquired by the processing device 104 from the magnetometer 102 (Block 202) at regular intervals, such as regular intervals of one second. After each data acquisition, the processing device 104 checks for an anomaly in the data collected either during that acquisition or during a certain time period including the acquisition (Block 204). The anomaly checking is performed by looking at the magnitude of the magnetic data, such as by seeing whether the sum of the magnitudes of the elements of the magnetic data exceeds a threshold. If an anomaly is detected, it is undesirable to use that magnetic data, and may even be undesirable to use magnetic data collected for a period prior to the one collected of that magnetic data, so a data buffer or data store storing the magnetic data (and previously collected magnetic data) is erased or deleted (Block 206), and then new magnetic data is acquired (back to Block 202).

If no anomaly was found, the magnetic data is checked to determine whether the magnetometer 102 was stationary or in motion during the data acquisition (Block 208). Such motion could be due to a pattern the user is instructed to move the electronic device 100 in. Whether the magnetometer 102 was stationary or in motion is determined by comparing the range of the magnetic data to a threshold range. If the magnetometer 102 was stationary, the magnetic data is unsuitable for calibration purposes, and the method then returns to acquiring magnetic data (back to Block 202).

If the magnetometer 102 was in motion during the data acquisition, a calibration status indicator is computed (Block 210). The calibration status indicator is computed as a function of the time elapsed since a last calibration, whether an anomaly was found and variation in total magnetic field. The calibration status indicator may also be computed as a function of the surroundings of the electronic device 100, for example, determined by reviewing data collected by the magnetometer 102 over certain interval in past and calculating the mean and variation of those data values. The various thresholds are design choices, and they ultimately determine if the calibration status indicator at a given time indicates whether or not calibration should proceed (Block 212). If calibration is to not proceed, such as due to the last calibration still being considered valid, then the method returns to acquiring magnetic sensor measurement data (back to Block 202).

If the calibration status indicator indicates that the last calibration is no longer valid, then the process of storing a unique magnetic data set for the calibration is started (Block 214). Unique magnetic data tuplet sets are extracted by comparing previously stored magnetic data to the current magnetic data from the magnetometer 102. In particular, the time difference between the previously stored magnetic data and the current magnetic data from the magnetometer 102 is calculated, and the Euclidean distance between the current magnetic data and the previously stored magnetic data is calculated. Previously stored magnetic data older than a given threshold time is discarded, and items of the current magnetic data that are unique are stored. The purpose of this step is to have a magnetic measurement data set with a wide range of values (variation), and preferably with values evenly spaced apart in terms of Euclidean distance.

Figure 3:
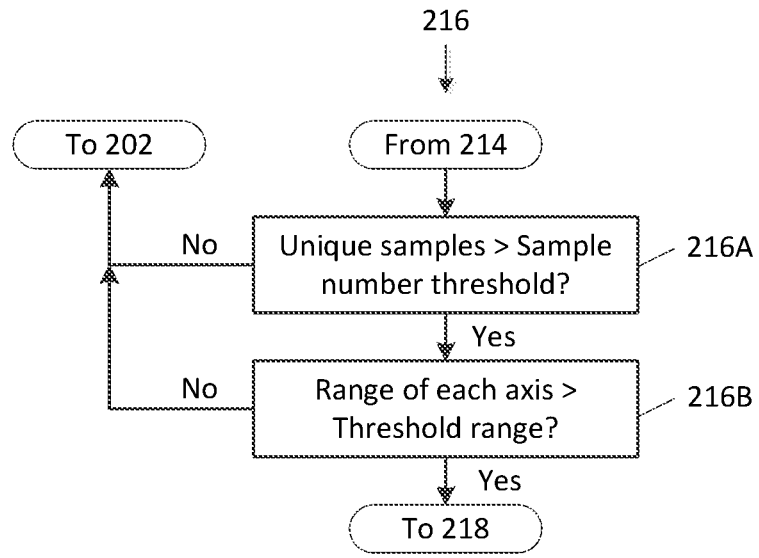
FIG. 3 is a flowchart showing individual steps of the sufficiency test of the flowchart of FIG. 2.

Once the magnetic data set is extracted, whether the magnetic data set is sufficient for use in the calibration process is determined (Block 216). Details of this sufficiency check are now described with additional reference to FIG. 3. A number of unique samples or members of the magnetic data set is determined and compared with a sample number threshold (Block 216A). If the number of unique samples is insufficient, the method returns to acquiring magnetic data (back to Block 202).

If the number of unique samples is sufficient, then the range of each axis of the magnetic data set is compared to a threshold range (Block 216B). If the range of each axis is not greater than the threshold range, then the method returns to acquiring magnetic data (back to Block 202). If the range of each axis is greater than the threshold range, then a sanity check is performed (Block 218).

Figure 4:
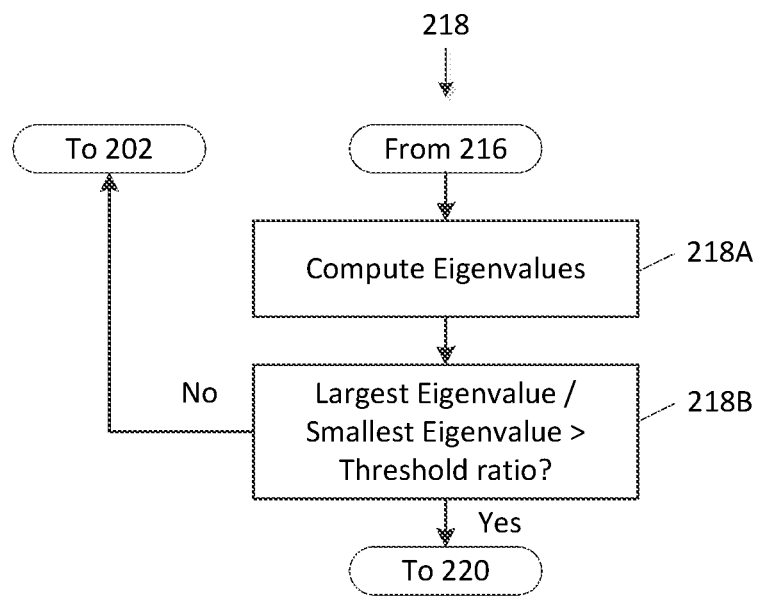
FIG. 4 is a flowchart showing individual steps of the sanity check of the flowchart of FIG. 2.

Details of this sanity check are now described with additional reference to FIG. 4. First, eigenvalues of cross correlation matrices of the magnetometer data are computed (Block 218A). The produced eigenvalues represent the variance of the magnetic data along three orthogonal axes (which may or may not be different than the axes of the magnetometer 102). If the ratio of the major and minor eigenvalue is greater than a threshold ratio (Block 218B), there is insufficient rotation along one axis for the magnetic data set to be used for calibration, or there is an excessively large variation along one axis which renders the magnetic data set undesirable for use for calibration, and the method returns to acquiring magnet data (Block 202).

If the ratio is less than the threshold ratio, then the sanity check has passed, and the method proceeds to calibration (Block 220). The calibration is performed via ellipsoidal fitting, with parameters for a parabolic curve first being generated, and constraints being used to check if the parameters satisfy an ellipsoid constraint. Further details of the ellipsoidal fitting will be given below.

After the calibration is performed, a consistency check is performed (Block 222) on new calibration parameters. The consistency check determines whether the newly calculated calibration parameters are consistent with previously stored calibration parameters and are within specific range. If the newly calculated calibration parameters are not consistent with the previously stored calibration parameters, based on a comparison of bias and scale factor, then it will not be stored, and the method returns to acquiring magnetic data (back to Block 202). Next, the newly calculated (and now stored at Block 228) calibration parameters are weighted together with the previously stored calibration parameters (Block 230). This weighting is performed as a function of the quality, consistency with rest of calibration parameters, and time elapsed between each set of calibration parameters and the present time. Calibration settings are then generated as a function of the weighted calibration parameters (Block 232), such as by computing the weighted mean of scale and bias. These results are then available for use by the processing device 104 in collecting data from the magnetometer 102. Collected magnetometer values may then be used in generating user output, affecting user input, and in making user interface decisions and operations.

Details of the calibration via ellipsoidal fitting will now be given. The magnetic data is affected by Hard Iron (HI) bias and Soft Iron (SI) bias. Mathematically, this can be represented as:

$$\hat{B} = SI*(B^m - HI) \tag{1}$$

where $B^m$ is the magnetic sensor measurement data from the magnetometer 102 which is affected by hard iron HI and soft iron SI, and $\hat{B}$ is true value. The HI will shift a generated sphere to nonzero origin and SI will deform the sphere to an ellipsoid. The total magnetic field can be represented as:

$$\hat{B}^T * \hat{B} = H^2 \tag{2}$$

And $$(B^m - HI)^T (SI^T * SI) * (B^m - HI) = H^2 \tag{3}$$

$$(B^m - HI)^T * R * (B^m - HI) = H^2 \tag{4}$$

Here R is a symmetric and square matrix. An ellipsoid fit algorithm would be able to compute the R matrix but there is an issue with computing the SI matrix from R, since there is no unique solution to R. Since the R matrix is symmetric and has 6 unknown parameters, and original SI matrix has 9 unknown variables, the SI matrix cannot be computed directly.

Stated another way, when a sphere is rotated the result will still be a sphere. So ultimately angle information is lost due to the squaring operation. In order to overcome this issue, a constraint that one axis is perfectly aligned with original direction is applied. Using this constraint, the SI matrix can be represented in the following format:

$$SI = \begin{bmatrix} a11 & 0 & 0 \\ a21 & a22 & 0 \\ a31 & a32 & a33 \end{bmatrix} \tag{5}$$

The SI matrix can thus be computed from R by performing a U-D factorization. Rearranging terms in the form of a distorted ellipsoid results in:

$$\epsilon(B_x^m, B_y^m, B_z^m) = aB_x^{m^2} + bB_y^{m^2} + cB_z^{m^2} + 2dB_x^m B_z^m + 2eB_x^m B_y^m + 2fB_y^m B_z^m + 2gB_y^m + 2hB_y^m + 2IB_y^m + G = 0 \tag{6}$$

The fitting of this conic equation can then be solved by minimizing the sum of squared distance $\epsilon(B_x^m, B_y^m, B_z^m)$, which can be represented as:

$$\beta = \sum_{i=1}^{N} \epsilon(B_{xi}^m, B_{yi}^m, B_{zi}^m)^2 = 0 \tag{7}$$

There are many solutions of this minimization and to fit as an ellipsoid, the following condition should be satisfied by the coefficient:

$$4(ab+bc+ac-d^2-e^2-f^2) > (a+b+c)^2 \tag{8}$$

The equation 8 can be written in following format:

$$A^T C A = \lambda$$

where A=[a,b,c,d,e,f,g,h,I,G]], $\lambda$ is positive and C is:

$$C(1:6, 1:6) = \begin{bmatrix} -1 & 1 & 1 & & & \\ 1 & -1 & 1 & & 0_{3\times 3} & \\ 1 & 1 & -1 & & & \\ & & & -4 & 0 & 0 \\ & 0_{3\times 3} & & 0 & -4 & 0 \\ & & & 0 & 0 & -4 \end{bmatrix}$$

After solving the equation, parameters are obtained and then the locus, rotation and radii of the ellipsoid are computed. Once the computation is completed, the algorithm checks the fitness of the coefficients and the range of the scale factor. If both are within range, the algorithm has been a success. This algorithm will return the best possible ellipsoid rather than quadratic curve coefficients.

It should be appreciated that the techniques described above provide for a magnetometer 102 that provides improved (i.e. more accurate and precise) results, and thus improve the function of the magnetometer 102 itself. It should also be appreciated that the various techniques described above must be performed more quickly than a human being could perform them on paper in order for the method to work. Indeed, the steps of the flowchart 200 of FIG. 2 are to be performed in under 3 seconds, or in under 2 seconds. It should also be understood that since the processing device 104 is configured to perform the steps described herein, the various transistors inside have been biased and configured in a specific configuration, making the processing device 104, as it functions herein, a specific purpose processing device 104.

The calibration settings are used either by the magnetometer 102 to adjust the data it collects, or by the processing device 104 to compute and provide calibrated magnetic field strength the data collected by the magnetometer 102. The data collected by the magnetometer 102, according to the calibration settings, may then be used for various functions, such as determining device orientation and determining device orientation with respect to Earth's magnet north.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

The invention claimed is:

1. A method, comprising:
   acquiring magnetic data from a magnetometer; and in a processing device, performing steps of:
    generating a calibration status indicator as a function of time elapsed since a last calibration and variation in total magnetic field in previously stored magnetic data, the calibration status indicator indicating whether a calibration process should be performed;
    detecting anomalies in the magnetic data;
    extracting a sparse magnetic data set only if the calibration status indicator indicates that the calibration process should be performed, the extraction performed using a comparison between the previously stored magnetic data and the magnetic data from the magnetometer, based on the calibration status indicator;
    generating calibration parameters for the magnetometer using a calibration method as a function of the magnetic data set, if the sparse magnetic data set is extracted and is sufficient;
    storing the calibration parameters in a calibration parameter store, based on performing a validation and stability check on the calibration parameters;
    weighting the calibration parameters and the previously stored calibration parameters to produce weighted calibration parameters, if the calibration parameters were stored in the calibration parameter store; and
    generating calibration settings for the magnetometer as a function of the weighted calibration parameters, if the weighted calibration parameters were produced.

2. The method of claim 1, wherein the calibration method comprises ellipsoidal fitting.

3. The method of claim 2, further comprising computing inherent sources of error using the ellipsoidal fitting.

4. The method of claim 3, wherein the inherent sources of error comprise bias, scale factor, and soft iron.

5. The method of claim 1, wherein the calibration parameters are recomputed if calibration status indicator indicates low quality which is based on the time elapsed since a last calibration exceeding a threshold elapsed time, variation in total magnetic field and the calibration status indicator indicating a an anomaly in the magnetic data.

6. The method of claim 1, wherein the magnetic data set is extracted so as to have minimum elements that have maximum Euclidian distances with respect to adjacent elements and that were acquired during a given time interval.

7. The method of claim 1, wherein the calibration parameters are generated as a set of newly generated calibration parameters; wherein the previously stored calibration parameters are stored as a plurality of sets of previously stored calibration parameters; and wherein the validity check includes comparing the set of newly generated calibration parameters to the plurality of sets of previously stored calibration parameters and discarding a set of calibration parameters which is most inconsistent with other sets of calibration parameters.

8. The method of claim 1, wherein the calibration parameters are stored in the calibration parameter store also based on a time difference between generation of the calibration parameters and the previously stored calibration parameters, and also based on space available in the calibration parameter store.

9. The method of claim 1, wherein the calibration parameters and the previously stored calibration parameters are weighed as a function of quality and a difference between generation thereof and present time.

10. The method of claim 1, wherein whether the magnetic data set is sufficient is determined by:
    determining a number of unique samples in the magnetic data set;
    determining a range of each axis off the magnetic data set; and
    determining that the magnetic data set is sufficient if the number of unique samples exceeds a threshold number of unique samples and if the range of each axis exceeds a threshold range for each axis.

11. The method of claim 10, wherein the calibration parameters are generated also based upon the validity check indicating that the magnetic data set is sane for the calibration method; and wherein performing the validity check on the magnetic data set comprises:
    computing eigenvalues of a cross correlation matrix formed from the magnetic data set;
    checking span and strength of each axis using the eigenvalues; and
    determining that the magnetic data set is sane if the span is less than a threshold ratio.

12. The method of claim 1, wherein the magnetometer is part of a portable electronic device; and further comprising operating the magnetometer pursuant to the calibration settings and changing a graphical display of the portable electronic device as a function of the magnetometer.

13. The method of claim 1, wherein the steps are performed in the processing device in under two seconds.

14. An electronic device, comprising:
    a magnetometer; and
    a processing device configured for:
        generating a calibration status indicator as a function of time elapsed since a last calibration and variation in total magnetic field in previously stored magnetic data, the calibration status indicator indicating whether a calibration process should be performed;
        detecting anomalies in the magnetic data;
        extracting a sparse magnetic data set only if the calibration status indicator indicates that the calibration process should be performed, the extraction performed using a comparison between the previously stored magnetic data and the magnetic data from the magnetometer, based on the calibration status indicator;
        generating calibration parameters for the magnetometer using a calibration method as a function of the magnetic data set, if the sparse magnetic data set is extracted and is sufficient;
        storing the calibration parameters in a calibration parameter store, based on performing a validation and stability check on the calibration parameters;
        weighting the calibration parameters and the previously stored calibration parameters to produce weighted calibration parameters, if the calibration parameters were stored in the calibration parameter store; and
        generating calibration settings for the magnetometer as a function of the weighted calibration parameters, if the weighted calibration parameters were produced.

15. The electronic device of claim 14, wherein the calibration method comprises ellipsoidal fitting.

16. The electronic device of claim 15, wherein the processing device is further configured for computing inherent sources of error using the ellipsoidal fitting.

17. The electronic device of claim 16, wherein the inherent sources of error comprise bias, scale factor, and soft iron.

18. The electronic device of claim 14, wherein processing device is further configured to recomputed the calibration parameters if calibration status indicator indicates low quality which is based on the time elapsed since a last calibration exceeding a threshold elapsed time and the calibration status indicator indicating a an anomaly in the magnetic data.

19. The electronic device of claim 14, wherein the processing device is configured to extract the magnetic data set so as to have minimum elements that have maximum Euclidian distances with respect to adjacent elements and that were acquired during a given time interval.

20. The electronic device of claim 1, wherein the calibration parameters are generated as a set of newly generated calibration parameters; wherein the previously stored calibration parameters are stored as a plurality of sets of previously stored calibration parameters; and wherein the validity check includes comparing the set of newly generated calibration parameters to the plurality of sets of previously stored calibration parameters and discarding a set of calibration parameters which is most inconsistent with other sets of calibration parameters.

* * * * *